United States Patent [19]
Partovi et al.

[11] Patent Number: 5,964,884
[45] Date of Patent: Oct. 12, 1999

[54] SELF-TIMED PULSE CONTROL CIRCUIT

[75] Inventors: Hamid Partovi, Sunnyvale; John Christian Holst, San Jose; Amos Ben-Meir, Cupertino, all of Calif.

[73] Assignee: Advanced Micro Devices, Inc., Sunnyvale, Calif.

[21] Appl. No.: 08/938,589

[22] Filed: Sep. 26, 1997

Related U.S. Application Data

[60] Provisional application No. 60/027,329, Sep. 30, 1996.

[51] Int. Cl.[6] ........................................ G06F 1/04
[52] U.S. Cl. .................. 713/503; 713/400; 713/401; 713/500; 713/501; 713/502; 711/167
[58] Field of Search .................. 395/376, 733, 395/800.23, 552, 553, 556

[56] References Cited

U.S. PATENT DOCUMENTS

| | | | |
|---|---|---|---|
| 4,714,924 | 12/1987 | Ketzler | 340/825.21 |
| 5,023,840 | 6/1991 | Tobita | 365/201 |
| 5,559,752 | 9/1996 | Stephens, Jr. et al. | 365/233 |
| 5,796,993 | 8/1998 | Maguire | 395/556 |
| 5,812,832 | 9/1998 | Horne | 395/556 |

FOREIGN PATENT DOCUMENTS

| | | |
|---|---|---|
| 0 302 795 | 2/1989 | European Pat. Off. . |
| 0 536 689 | 4/1993 | European Pat. Off. . |
| 0 550 215 | 7/1993 | European Pat. Off. . |

OTHER PUBLICATIONS

AMD–K5 Processor Data Sheet, http://www.amd.com/products/cpg/techdocs/techdocs.html, pp. 4, 8–9, Jan. 1997.

Grueb, H.J., et al.: "Key Components of the Fast Reduced Instruction Set Computer (FRISC) Employing Advanced Bipolar Differential Logic and Wafer Scale Multichip Packaging", Proceedings Of The Bipolar Circuits And Technology Meeting, Minneapolis, Sep. 12–13, 1988, pp. 19–22, XP000255385.

*Primary Examiner*—Meng-Ai T. An
*Assistant Examiner*—Stacy Whitmore
*Attorney, Agent, or Firm*—Skjerven, Morrill, MacPherson, Franklin & Friel LLP; Ken J. Koestner

[57] ABSTRACT

A Self-Timed Pulse Control circuit and operating method is highly useful for adjusting delays of timing circuits to prevent logic races. In an illustrative example, the STPC circuit is used to adjust timing in self-timed sense amplifiers. The Self-Timed Pulse Control (STPC) circuit is integrated onto an integrated circuit chip along with the circuit structures that are timed using timing structures that are adjusted using STPC. The STPC is also advantageously used to modify the duty cycle of clocks, determine critical timing paths so that overall circuit speed is optimized, and adjusting dynamic circuit timing so that inoperable circuits become useful.

40 Claims, 9 Drawing Sheets

SELF-TIMED PULSE CONTROL CIRCUIT

CROSS-REFERENCE TO RELATED APPLICATION

This application claims the benefit under 35 U.S.C. §119 (e) of U.S. Provisional Application Serial No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which provisional application discloses an exemplary embodiment of the present invention and which is incorporated herein by reference in its entirety.

BACKGROUND OF THE INVENTION

1. Field of the Invention

The present invention relates to timing circuits, systems, and control methods. In more specific applications, the invention relates to timing adjustment circuits for controlling logic races.

2. Description of the Related Art

Microprocessor architectures are continually evolving to improve and extend the capabilities of personal computers. Execution speed, power consumption, and circuit size are aspects of microprocessors and microprocessor performance that are constantly addressed by processor architects and designers in the ongoing quest for an improved product. Execution speed not only depends on the clock rate of a processor, but also upon the speed of interfaces such as cache memories and buses that supply instructions and data for execution by a processor core. The execution speed of microprocessors is heavily analyzed and compared using standard benchmark tests for judging the performance of competing entries into the microprocessor market.

Logic races are conditions that occur in a situation in which logic gates are enabled by signals received from a clocked device. If a data signal that is synchronized by a clock is delayed with respect to the clock, then incorrect data is propagated in a synchronous system.

One example of a circuit that may be affected by logic races is a self-timed regenerative sense amplifier in a memory circuit such as a cache. A memory array is activated by a signal on a word line in a parallel address path. A clock signal is buffered to strobe the self-timed, regenerative sense amplifier. A problem that may arise is that the sense amplifier may be strobed too early, before a sufficient signal is developed on the bit lines, so that an incorrect value is sensed by the sense amplifiers. Since the sense amplifier is regenerative, recovery of the error does not occur.

In manufactured integrated circuits, a sense amplifier has a specific offset voltage that varies as a function of sense amplifier design, layout, process, matching of devices in the process, and the like. Therefore, the offset voltage of the sense amplifiers on a integrated circuit varies within some range. During the design of the integrated circuit, the ultimate matching of devices, the performance resulting from the layout, and other design effects are difficult to anticipate. Therefore, a designer has difficulty ascertaining how aggressively to set device dimensions that determine the timing characteristics in a synchronous system. If the timing is set too aggressively, logical races may result since logic race conditions are generally avoided by delaying clock signals with respect to data. However, if the timing is not sufficiently aggressive, the integrated circuit speed performance is compromised.

What are needed in microprocessors are circuits and operating methods for attaining a fast speed performance while avoid logic races.

SUMMARY

It has been discovered that a Self-Timed Pulse Control circuit and operating method is highly useful for adjusting delays of timing circuits to prevent logic races. In an illustrative example, the STPC circuit is used to adjust timing in self-timed sense amplifiers. The Self-Timed Pulse Control (STPC) circuit is integrated onto an integrated circuit chip along with the circuit structures that are timed using timing structures that are adjusted using STPC. The STPC is also advantageously used to modify the duty cycle of clocks, determine critical timing paths so that overall circuit speed is optimized, and adjusting dynamic circuit timing so that inoperable circuits become useful.

In accordance with one embodiment of the present invention, a modulation circuit modulates timing of a timing signal. The timing signal controls timing of a timed circuit. The timed circuit is integrated into an integrated circuit. The modulation circuit includes an input timing signal terminal, a timing control storage, and a controlled variable timing element integrated into the integrated circuit. The timing element has an input terminal connected to the input timing signal terminal for receiving a timing signal, a control terminal connected to the timing control storage for receiving a modulation control signal, and an output terminal generating a modulated timing signal having a timing based on the timing signal and the modulation control signal.

In accordance with another embodiment of the present invention, a circuit includes a regenerative self-timed sense amplifier, and a modulation circuit integrated into an integrated circuit and connected to the sense amplifier. The modulation circuit generates a timing signal for controlling timing of the sense amplifier. The modulation circuit includes an input timing signal terminal, a timing control storage, and a controlled variable timing element integrated into the integrated circuit. The timing element has an input terminal connected to the input timing signal terminal for receiving a timing signal, a control terminal connected to the timing control storage for receiving a modulation control signal, and an output terminal generating a modulated timing signal having a timing based on the timing signal and the modulation control signal.

In accordance with another embodiment of the present invention, a processor includes an execution engine, an instruction decoder connected to the execution engine, and a cache connected to the instruction decoder. The instruction decoder decodes instructions and supplies operations to the execution engine for execution. The cache supplies instructions to the instruction decoder for decoding into operations. The cache has a circuit including a regenerative self-timed sense amplifier and a modulation circuit integrated into an integrated circuit and connected to the sense amplifier. The modulation circuit generates a timing signal for controlling timing of the sense amplifier. The modulation circuit includes an input timing signal terminal, a timing control storage, and a controlled variable timing element integrated into the integrated circuit. The timing element has an input terminal connected to the input timing signal terminal for receiving a timing signal, a control terminal connected to the timing control storage for receiving a modulation control signal, and an output terminal generating a modulated timing signal having a timing based on the timing signal and the modulation control signal.

Many advantages are achieved by the described memory circuit and operating method. It is advantageous that STPC supplies a technique for correcting the operation of a circuit that functions incorrectly or less than optimally. The STPC advantageously optimizes integrated circuit timing to account for timing errors that result from inaccuracies in integrated circuit extraction, integrated circuit simulation methodology, fabrication process variations, mismatching of transistor thresholds, and the like. In the application of a sense amplifier, the STPC advantageously accelerates operation of the sense amplifier and improves performance. The STPC is advantageously used to characterize timing margins and implement the margins during device layout. It is further advantageous that the STPC is highly useful for debugging speed paths in an integrated circuit and determining which speed paths are critical paths.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1:
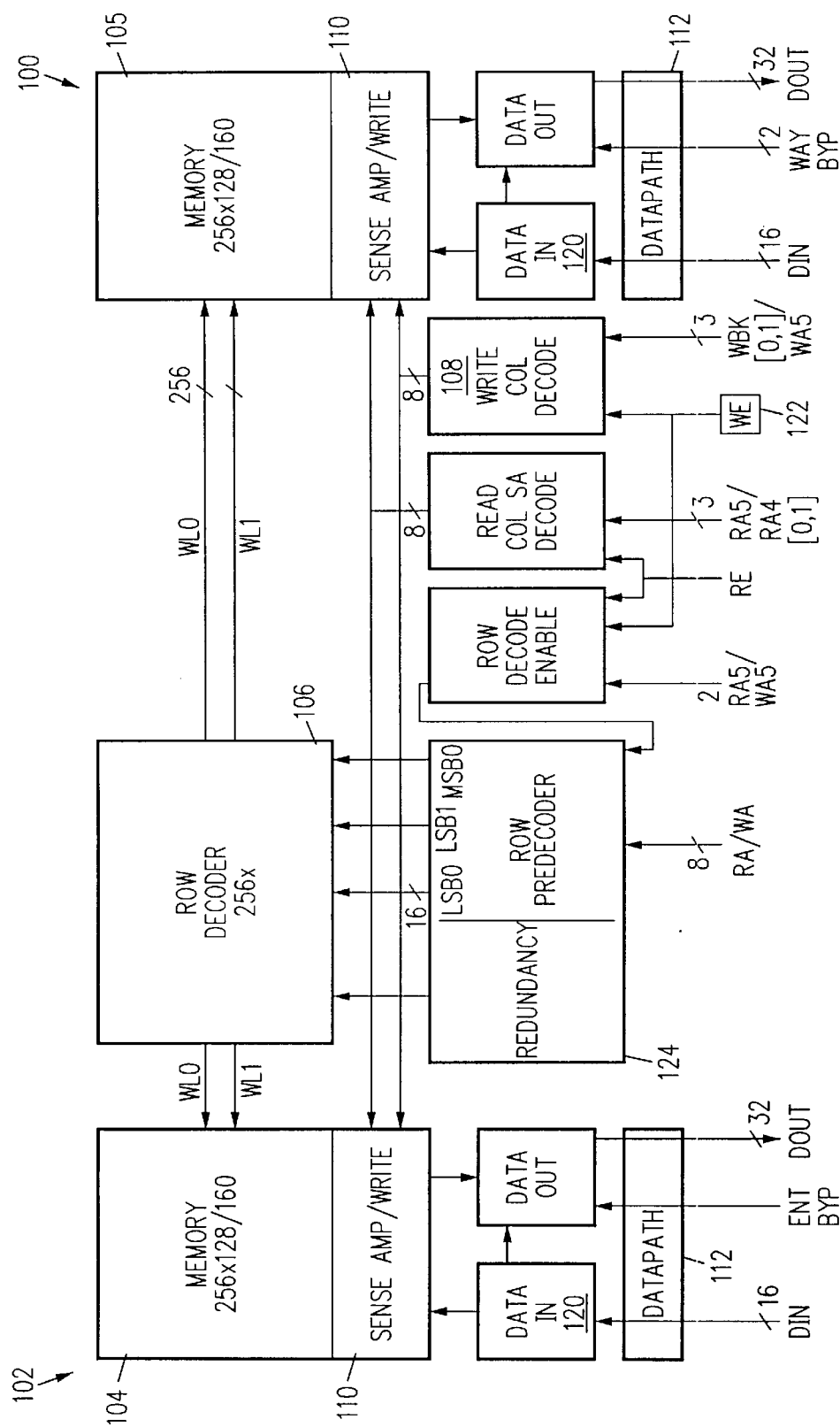
FIG. 1 is a schematic block diagram illustrating an embodiment of a cache which is suitable for usage as the data cache or the instruction cache shown hereafter in FIG. 10.

Referring to FIG. 1, a schematic block diagram shows an embodiment of a cache 100 which is suitable for usage as the L1 instruction cache 1002 or the data cache 1040 shown in FIG. 10 hereinafter, or the predecode cache (not shown). The microprocessor 1000 has several level-one (L1) caches including the 32 kB L1 instruction cache 1002, the 32 kB data cache 1040, and the 20 kB predecode cache 1006. The L1 instruction cache 1002 and the data cache 1040 are 32 kB, two-way set-associative caches with a 64 byte line size, 32 byte sub-blocking, and constructed in 8 kB blocks. The predecode cache is constructed in 10 kB blocks. The L1 instruction cache 1002 and data cache 1040 are filled on a sub-block basis, physically-tagged, and virtually-indexed with bits 13:6, where bits 13:12 are translated address bits. Synonyms and aliasing are handled in hardware. The L1 instruction cache 1002 and data cache 1040 maintain mutual exclusion to simplify handling of self-modifying code. A hit-under-miss capability is supported. Each of the L1 instruction cache 1002 and the data cache 1040 include 256 sets. Each set contains two ways (or lines) and each line contains two sub-blocks so supply a total storage of 256× 2×64 B=32 kB.

FIG. 1 depicts a cache block 102 having a size of 8 kB. The illustrative cache block 102 includes two cache arrays 104 and 105, each having 256 rows and 128 columns. The cache block 102 supports a byte write function. Row decode 106, column write decode 108, sense amplifier decode 110, and datapath 112 circuits utilize dynamic logic with keepers for delay improvement. The dynamic circuits are held static by weak keepers. While the decode 106, 108, and 110 and datapath 112 circuits are dynamic logic, data input circuits 120, bypass circuits (not shown), and storage buffers (not shown) are circuits constructed using conventional-type CMOS logic.

A write eviction buffer 122 has conventional-type memory cells to efficiently implement 4×256 storage locations using CMOS logic. Asynchronous input control signals are connected to the write eviction buffer 122 to access the four storage levels. Predecode expansion logic 124 is implemented in dual-rail, dynamic, non-clocked logic.

The cache block 102 uses time multiplexing to perform one read operation and one write operation per clock cycle using a read column select and column read decode 116 that are separate from a write column select and column write decode 118.

Predecode expansion logic (not shown) is implemented in dual-rail dynamic non-clocked logic. A scan functionality is implemented in sense amplifiers 114 to supply array bit-mapping and datapath logic testability. Testability is further enhanced by usage of separate array and word line power supplies (not shown) so that that retention is tested at the time of wafer sort in a manufacturing process to determine functionality of p-channel pull-up transistors (not shown) in the memory cells. Dual word-lines (not shown) are used in each row in combination with a one-of-two block select to reduce power consumption.

The row decode 106 drives word lines wl to the two cache arrays 104 and 105 for both read and write operations. The row decode 106 includes flip-flops (not shown) and multiplexing (not shown) for write addresses and read addresses that is located after the flip-flops. The row decode 106 includes pairs of word line drivers per memory cell pitch and decoded by the least significant column decode bit so that either or both word lines are selectively activated dependent on wrap-around between upper or lower cache line words. The paired word line structure advantageously reduces power consumption.

The L1 instruction cache 1002 and the data cache 1040 have physical tags, handle synonyms and aliasing in hardware, support hit under miss, and maintain mutual exclusion to assist the handling of self-modifying code.

Figure 2:
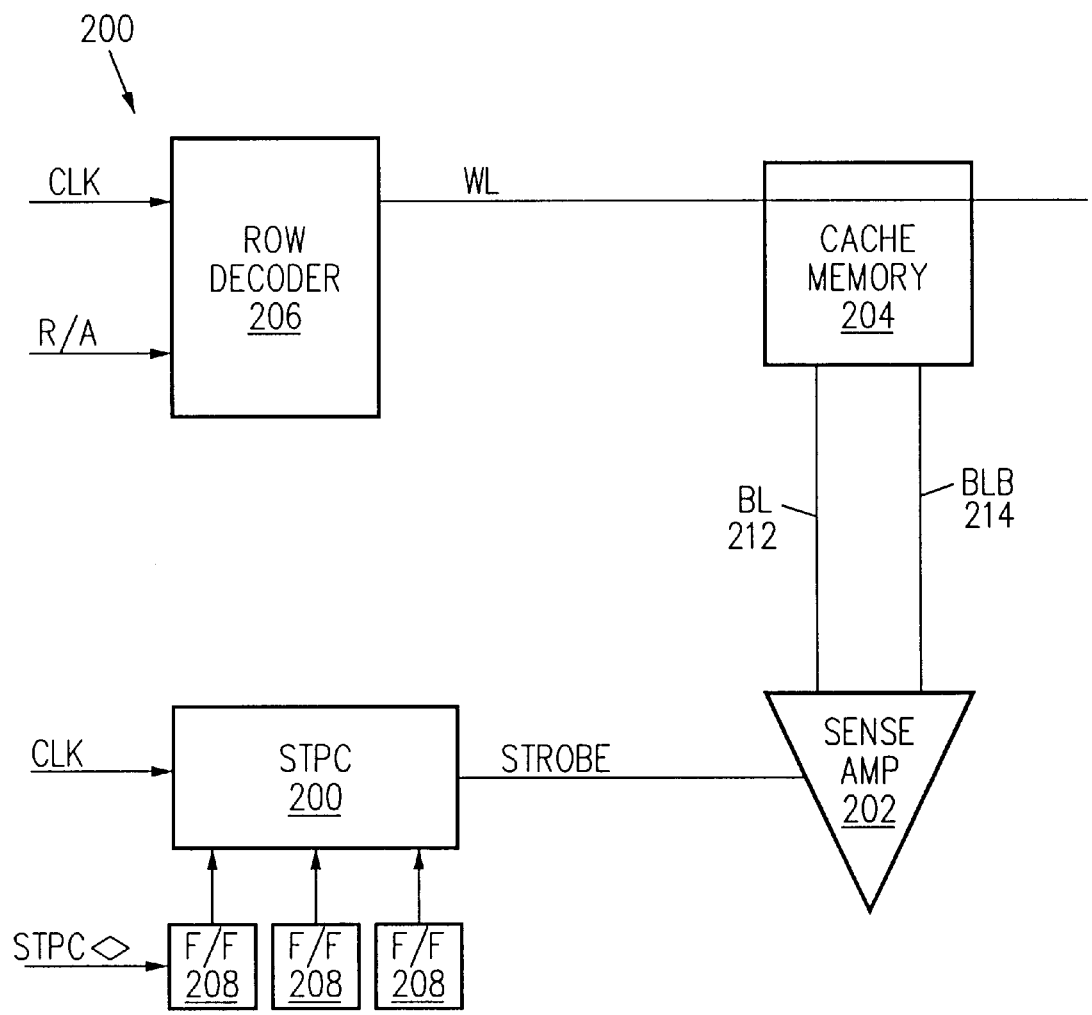
FIG. 2 is a schematic block diagram which illustrates an application of self-timed pulse control (STPC) circuit, supplying strobe timing to a sense amplifier.

Referring to FIG. 2, a schematic block diagram illustrates an application of a self-timed pulse control (STPC) circuit 200. In this example, the self-timed pulse control (STPC) circuit 200 supplies strobe timing to a self-timed sense amplifier 202 to indicate when adequate signal for reliable operation is available to the sense amplifier 202. A self-timed sense amplifier is defined as a sense amplifier having a timing strobe that is generated by a circuit that tracks some of the delay so that an inherent race condition occurs. As the frequency of operation is relaxed, the timing of the sense amplifier relative to the signals that are sensed does not change so that the timing of the self-timed sense amplifier is timed completely internally and is not affected by external signals such as clock frequency signals. Accordingly, no external control is exercised over the timing of the sense amplifier.

The sense amplifier 202 is a strobed regenerative sense amplifier, a highly suitable and advantageous sense amplifier for synchronous circuit applications such as microprocessors. A strobed regenerative sense amplifier advantageously has good sensitivity, sensing very small amplitude signals, and operating at high speed. In contrast, asynchronous circuits ripple through a plurality of timing stages in which each stage is clocked by the output of a previous stage, slowing circuit operation due to an accumulation of delays.

The sense amplifier 202 samples output signals from a cache memory 204 which is addressed by a row decoder 206, such as the row decoder. To retrieve information from a particular location in the cache memory 204, row and column address signals are applied to the cache to address a storage element of the cache memory 204. Row addresses RA and a clock signal CLK are applied to the row decoder 206. The row addresses RA are decoded by the row decoder 206, which responds to the clocked signals by generating word line signals WL that are applied to the cache memory 204. Activation of the row decoder 206 by the clock signal CLK results in synchronous operation of the cache. The word line signals WL activate a storage element in the cache memory 204 which responds to the word line signals WL by generating signals on bit lines 212 and bit bar lines 214 that are connected to the sense amplifier 202. Column addresses are applied to a column decoder (not shown) to select particular bit line and bit line bar signals. The sense amplifier 202 samples the output signals on the bit line and the bit bar line from a cache memory 204 at a time determined by a pulse of a sense amp strobe signal STROBE from the self-timed pulse control (STPC) circuit 200 and generates a strobed sensed output signal.

The self-timed pulse control (STPC) circuit 200 is adjusted to finely control timing of output signals from the cache memory 204. Control signals to the self-timed pulse control (STPC) circuit 200 are adjusted to strobe the sense amplifier 202 as quickly as possible so that the access time of the memory read is maximized. However, the self-timed pulse control (STPC) circuit 200 does not strobe the sense amplifier 202 so quickly that the sense amplifier 202 is activated before a sufficient signal from the cache memory 204 is applied to the bit line and the bit bar line.

The self-timed pulse control (STPC) circuit 200 is a timing circuit element that receives an input clock signal CLK and generates a strobe output clock signal STROBE having a timing that is delayed from the input clock signal CLK by an amount determined by a plurality of control input bits CTRL<2:0>. One example of a timing circuit element is a controlled variable delay line. In the illustrative embodiment, three control input bits CTRL<2:0> are utilized although more or fewer control bits may be used in other embodiments. The control input bits CTRL<2:0> are supplied by a memory element, in the illustrative example, a plurality of flip-flops 208 although other types of storages, memory, registers, or scannable registers may be used. The integrated circuit powers up with the flip-flops 208 in a known default state. In one example, the flip-flops 208 are cleared on reset to attain a default setting that advantageously is the shipping state for an integrated circuit product. In various embodiments, the memory element is set using a plurality of techniques. In one example, the flip-flops 208 are loaded through the microprocessor execution of a sequence of program codes such as codes contained in a Basic Input/Output System (BIOS) ROM, an emulation code ROM, various other permanently or temporarily encoded storages, or system RAM. For example, an emulation code routine may be initiated at system power-up that bootstrap loads program code into memory and initializes hardware systems in the integrated circuit including setting of bits in the flip-flops 208. In other embodiments, loading of the flip-flops 208 is controlled by a JTAG scan that scans selected values into the flip-flops 208.

The code or combination of 1s and 0s that is loaded into the flip-flops 208 generates a different timing delay characteristic of the self-timed pulse control (STPC) circuit 200. Devices are sized and layout designed to set a nominal timing for the sense amplifier 202 to a defined design criteria. For example, timing is set to strobe the sense amplifier 202 when a signal of 150 mV is applied to the amplifier. By altering the codes applied to the flip-flops 208, strobing of the sense amplifier 202 is adjusted to occur earlier or later at a defined delay step increment.

The adjustable sense amplifier strobe timing is highly advantageous for correcting any timing difficulties or logic races resulting from inaccuracies in parasitic extraction tools, mispredictions made in critical path simulations, mismatching of device, and the like. Adjustment of codes applied to the flip-flops 208 advantageously allows modulation of timing and delaying of strobe timing if the timing is set too aggressively in the self-timed path of memory access without microprobing that is difficult to achieve in an integrated circuit.

Although the illustrative self-timed pulse control (STPC) circuit 200 is used to set timing for the sense amplifier 202 of the cache memory, other STPC circuits may be utilized in all memories of the microprocessor.

Figure 3:
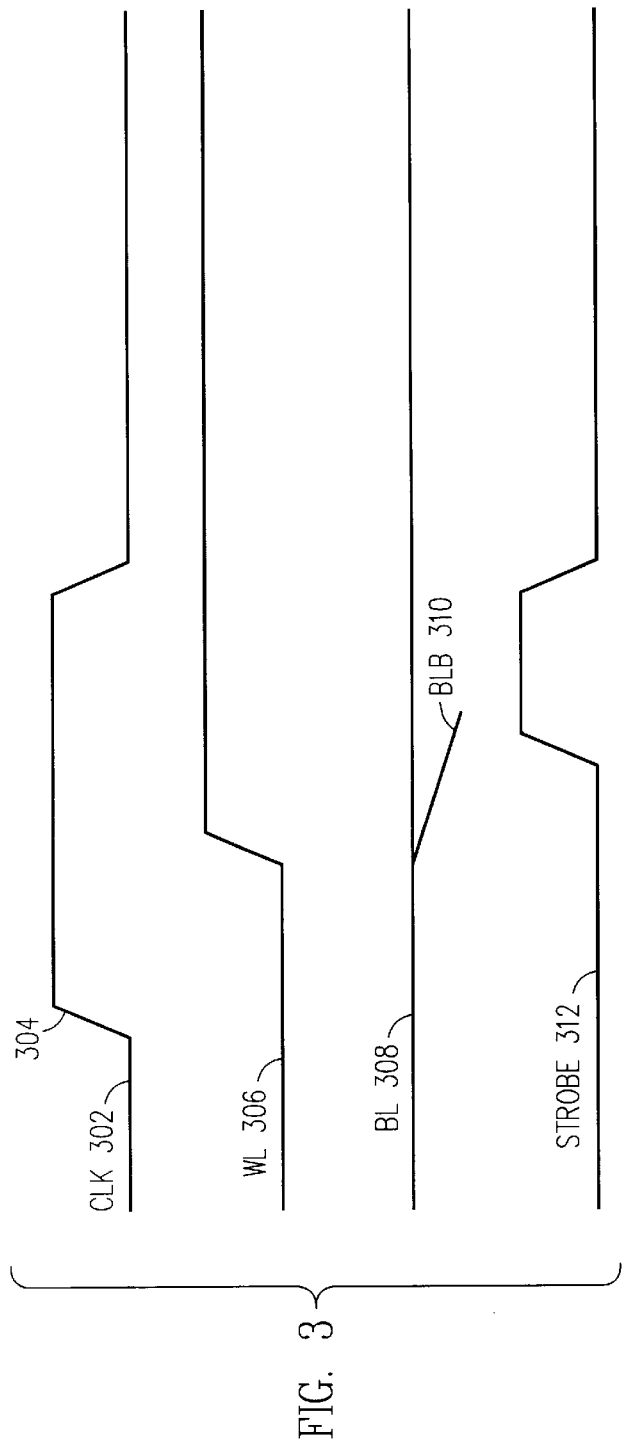
FIG. 3 is a schematic timing diagram illustrates timing of the self-timed pulse control (STPC) circuit.

Referring to FIG. 3, a schematic timing diagram illustrates timing of the self-timed pulse control (STPC) circuit 200. The clock signal CLK 302 is input to the self-timed pulse control (STPC) circuit 200. External to the self-timed pulse control (STPC) circuit 200, the rising edge 304 of the clock signal CLK 302 triggers a signal on the word line WL 306, that goes active a preset interval following the rising edge 304. A bit line signal BL 308 and a bit line bar signal BLB 310 are triggered by the rising edge of the word line WL 306, one of the signals remaining high and the other signal being discharged by the memory cell. The self-timed pulse control (STPC) circuit 200 generates a strobe output clock signal STROBE 312 at a delay determined by the setting of the flip-flops 208, independently of the signals on the word line 306, and the bit line BL 308 and the bit bar line BLB 310.

Figure 4:
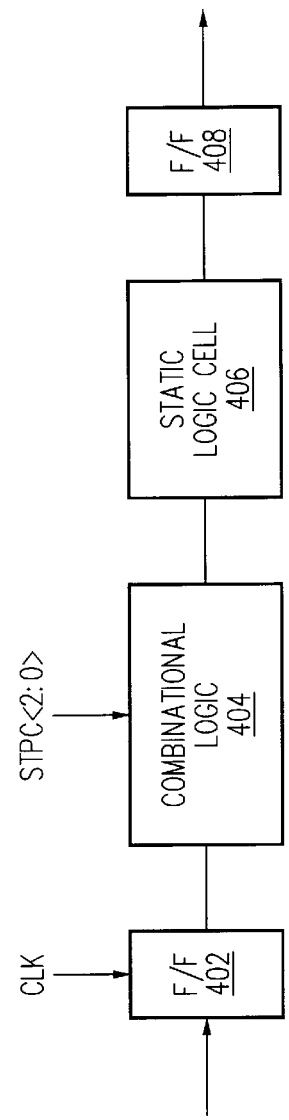
FIG. 4 is a schematic block diagram illustrating a high-level view of generic applications of the self-timed pulse control (STPC) circuit.

Referring to FIG. 4, a schematic block diagram illustrates a high-level view of generic applications of self-timed pulse control (STPC). In one application, self-timed pulse control (STPC) is used to debug speed paths in a microprocessor as a whole. A typical speed path in a microprocessor, such as a critical speed path, begins with a first flip-flop 402 which is connected to an input clock signal CLK. A signal from the first flip-flop 402 is input to a combinational logic block 404 that is controlled by a self-timed pulse control (STPC) signal STPC<3:0>. In one example, the combinational logic block 404 is a custom-designed Macro. A timing signal from the combinational logic block 404 or Macro, as adjusted by the self-timed pulse control (STPC) signal STPC<3:0>, is input to a static logic cell 406. The static logic cell 406 is generically defined as static, standard cell circuits. A timing signal from the static logic cell 406 is applied to a second flip-flop 408, completing the speed path. The combinational logic block 404 or Macro receives control bits from a STPC source (not shown) and generates an adjusted timing signal for application to the static logic cell 406.

Where the static logic cell 406 is a memory, the combinational logic block 404 changes the timing of a sense amplifier strobe, resulting in adjustment of the timing of information read from the memory. For example, if the STPC control bits cause a delay in the sense amplifier strobe signals, then the timing of the memory output signals is delayed. Accordingly, where the combinational logic block 404 or Macro defines a memory, STPC bits may be controlled to advance or delay the sense amplifier and characterize the maximum frequency of a memory integrated circuit for different settings of the STPC bits. Critical path analysis is performed by adjusting the STPC bits to slow the read rate of the memory. If the maximum frequency of the integrated circuit does not change when the read rate of memory is slowed, the path is not a critical path of the integrated circuit. Critical path analysis using self-timed pulse control (STPC) is useful for isolating particular timing paths and confirming timing simulations. Timing simulations typically have some inaccuracy due to the complexity of fully defining all timing in a complex circuit.

In another application, the self-timed pulse control (STPC) circuit 400 is used to characterize offset voltages of sense amplifiers. Multiple different codes are applied to a set of flip-flops 408 that drive a strobe timing signal to a sense amplifier connected to a memory. Memory performance is tested for each of the multiple different codes to determine the codes for which the memory fails. Offset voltages are determined based on the codes that cause memory failure. Furthermore, the offset voltage characterizations may be compared with simulation results to rate performance of the sense amplifiers and to determine how aggressively to set timings for the sense amplifiers of subsequent generations or revisions of an integrated circuit.

Figure 5:
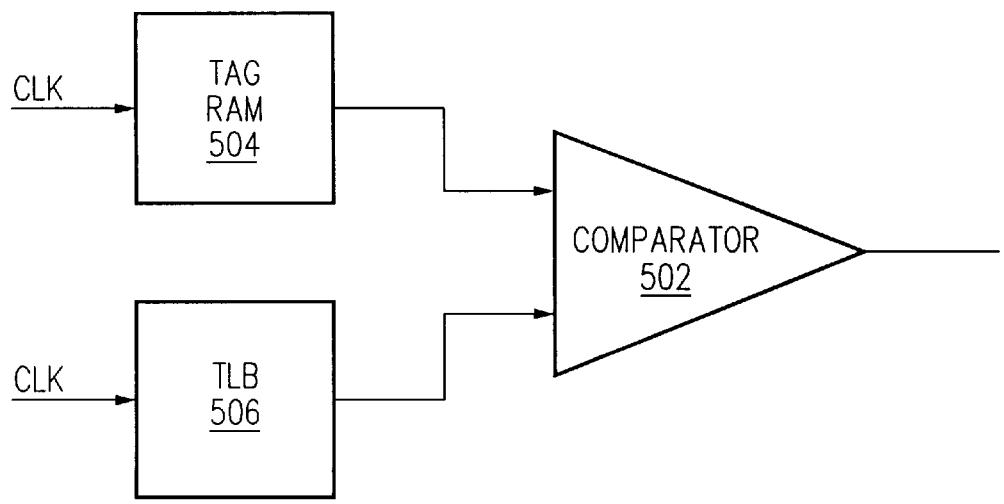
FIG. 5 is a highly schematic block diagram illustrating an application of self-timed pulse control (STPC) in a cache memory.

Referring to FIG. 5, a highly schematic block diagram illustrates an application of self-timed pulse control (STPC) in a comparator circuit. Self-timed pulse control (STPC) circuit is useful for debugging a cache memory that includes a differential self-timed comparator 502 for comparing data from a tag RAM memory 504 and a translation lookaside buffer (TLB) 506. Failure of a differential self-timed comparator 502 is analyzed by changing STPC codes applied to the tag RAM memory 504 and the translation lookaside buffer (TLB) 506 independently to determine which source of signals is out of synchrony. Self-timed pulse control (STPC) is advantageously used to diagnose timing errors.

Self-timed pulse control (STPC) is also advantageously used to characterize the timing margin of a circuit. STPC can be used to evaluate how much additional signal exists beyond the minimum necessary for functionality. Transistors and devices may age over time and change operating characteristics due to hot carrier effects and the like. Advantages are gained by operating an integrated circuit with some margin so that degradation of some transistors over the lifetime of the integrated circuit do not cause failure. STPC analysis therefore is advantageous for guaranteeing that an integrated circuit meets minimum signal margin specification.

Figure 6:
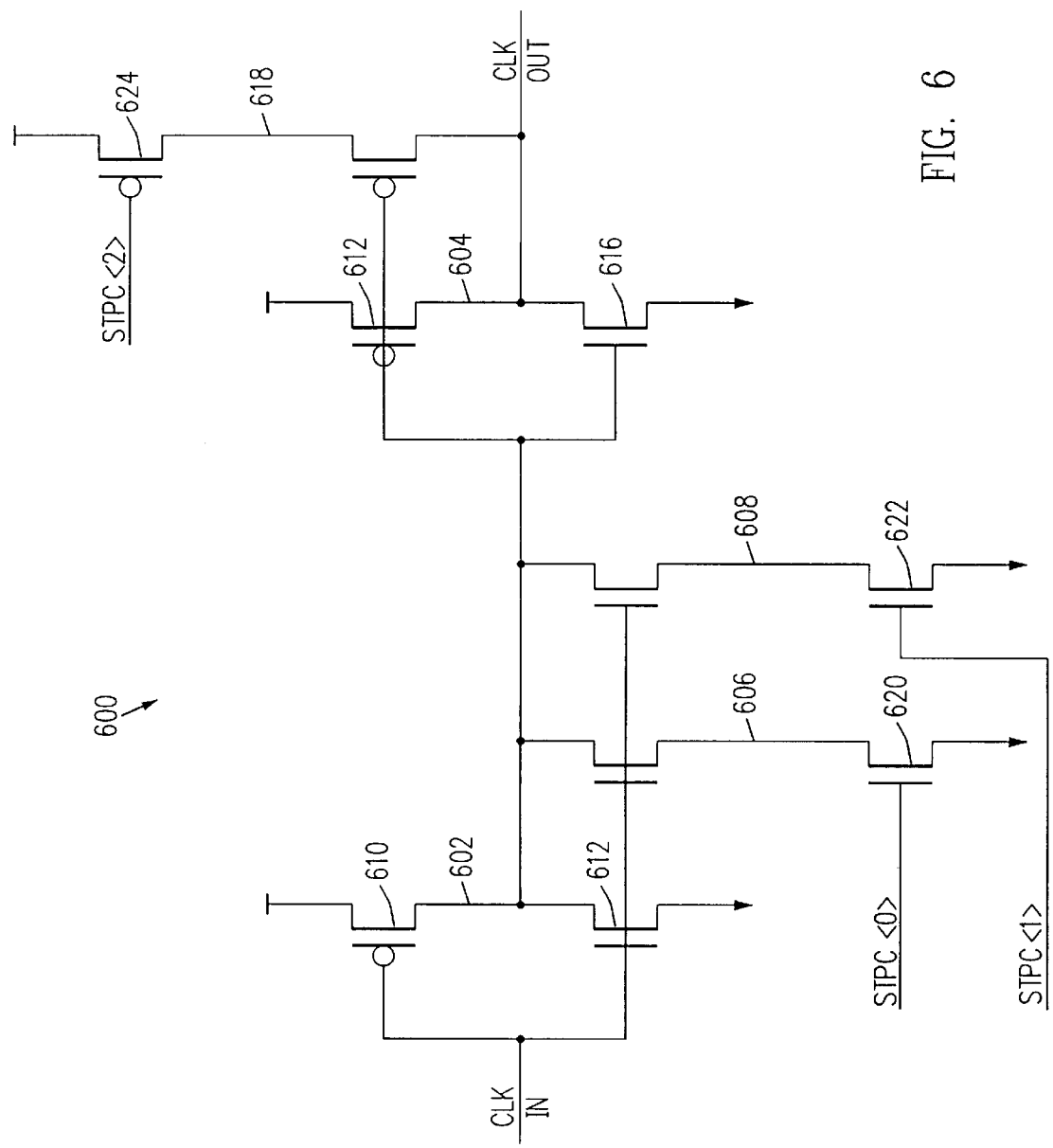
FIG. 6 is a schematic circuit diagram depicting an embodiment of a Self-Timed Pulse Control (STPC) circuit in the form of an inverter chain.

Referring to FIG. 6, a schematic circuit diagram depicts an embodiment of a Self-Timed Pulse Control (STPC) circuit 600 in the form of an inverter chain. The Self-Timed Pulse Control (STPC) circuit 600 has a first stage inverter 602 and a second stage inverter 604. An input signal IN is applied to the first stage inverter 602. The input signal IN is typically a clock signal CLK, or a signal derived from the clock signal CLK, but may be another signal. For example, in some memory circuits a plurality of most-significant predecode bits are ORed together and applied to the Self-Timed Pulse Control (STPC) circuit 600 as an input signal.

The first stage inverter 602 and the second stage inverter 604 are CMOS inverters having the structure of a push-pull switch including p-channel MOSFETs 610 and 612, respectively and n-channel MOSFETs 614 and 616, respectively. The CMOS inverters have a high input impedance in both high and low states and no quiescent current. The first stage inverter 602 is connected to a first stack of n-channel MOSFETs 606 that is controlled by a STPC<0> bit and is connected to a second stack of n-channel MOSFETs 608 that is controlled by a STPC<1> bit. The second stage inverter 604 is connected to a third stack of n-channel MOSFETs 618 that is controlled by a STPC<2> bit. The first stage inverter 602 and the second stage inverter 604 delay the clock signal CLK so that a delayed signal is generated as a strobe output clock signal STROBE. The delay of the strobe output clock signal STROBE is modulated by the first stack of n-channel MOSFETs 606, second stack of n-channel MOSFETs 608, and the third stack of n-channel MOSFETs 618 under control of the STPC<2:0> bits. When a STPC bit activates a stack of n-channel MOSFETs, the stack increases the current drive of the stage inverter connected to the stack so that an output node of the inverter falls faster and the delay of the inverter is shortened. For example, if the STPC<0> bit is high, an n-channel MOSFET 620 of the first stack of n-channel MOSFETs 606 is activated and an n-channel MOSFET 622, also of the first stack of n-channel MOSFETs 606, is activated by the rising edge of the input clock signal CLK so that the first stack of n-channel MOSFETs 606 is activated. The first stack of n-channel MOSFETs 606 supplies additional drive to the first stage inverter 602 and drives an output node 624 faster, reducing the delay of the Self-Timed Pulse Control (STPC) circuit 600. A high signal for the STPC<1> bit similarly reduces the delay of the first stage inverter 602. A low signal for the STPC<2> operates similarly to reduce the delay of the second stage inverter 604. In other embodiments, the number and arrangement of stacks connected to inverters is structured to adjust the delay in a desired manner. For example, additional stacks may be connected to an inverter to increase the granularity of the delay modulation. A Self-Timed Pulse Control (STPC) circuit 600 including one or more CMOS inverters with a delay modulated using transistor stacks advantageously lays out compactly in an integrated circuit, and has a simple structure.

Figure 7:
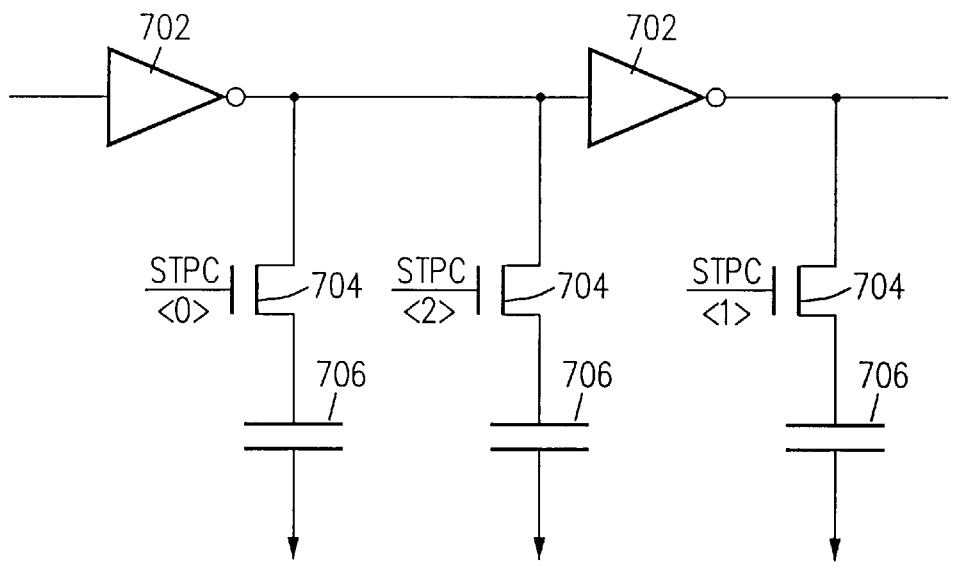
FIG. 7 is an alternative embodiment of a Self-Timed Pulse Control (STPC) circuit that includes one or more inverters for inserting delay into a clock signal.

Referring to FIG. 7, an alternative embodiment of a Self-Timed Pulse Control (STPC) circuit 700 includes one or more inverters 702 that insert delay into a clock signal. STPC control bit signals are input to transistor switches 704 that activate and deactivate capacitors 706 connected to output terminals of the inverters 702.

Figure 8:
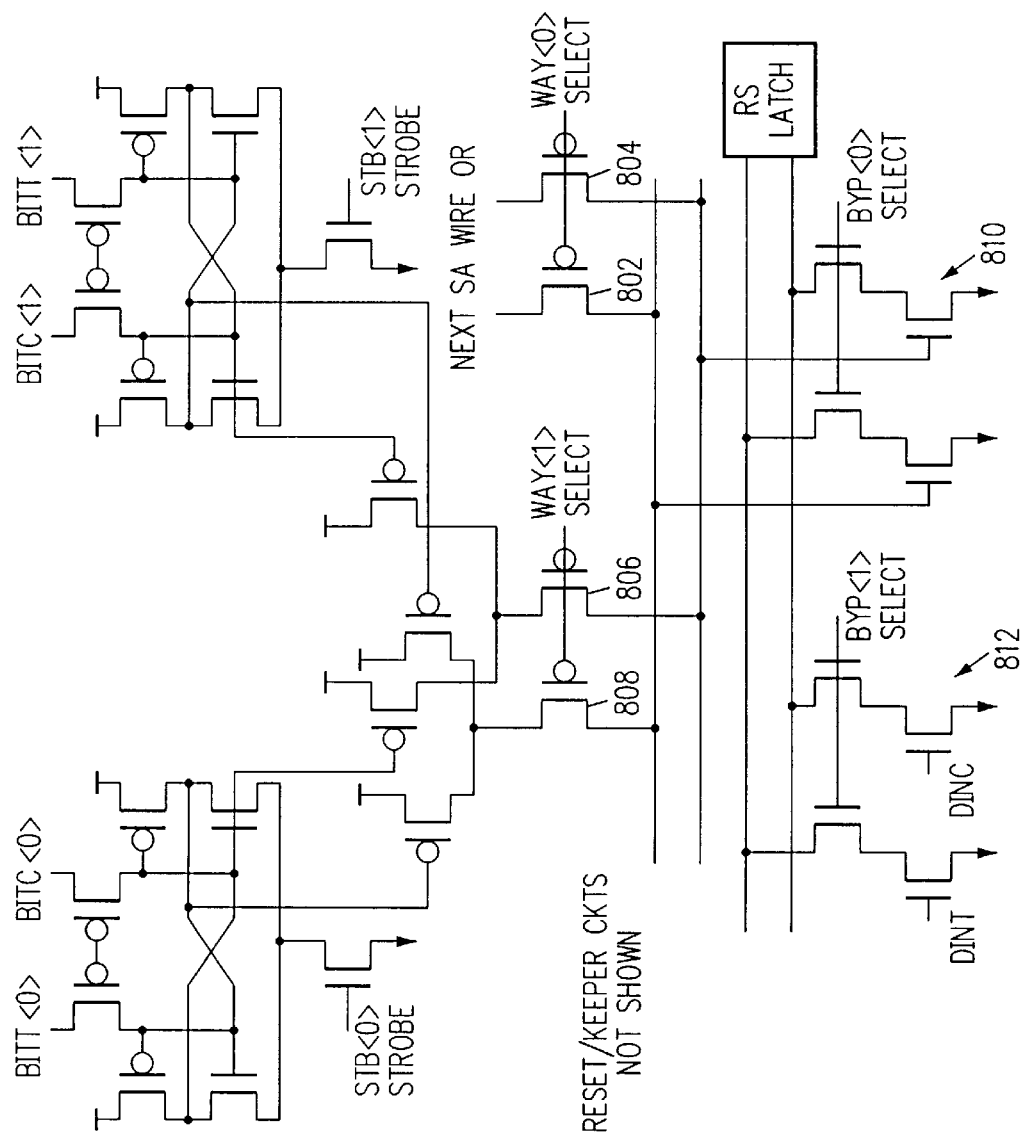
FIG. 8 is a schematic circuit diagram that illustrates an embodiment of the sense amplifiers shown in FIG. 1.

Referring to FIG. 8, a schematic circuit diagram illustrates an embodiment of the sense amplifiers 114 shown in FIG. 1.

The sense amplifiers 114 utilize a one per column pitch regenerative sense amplifier architecture that permits late selection by the column decode and way select after cache sensing is toleranced for offsets. Sense amplifier select signals are decoded and the decoded signals are wire-ORed for column selection by transistors 802 and 804 for way <0> and by transistors 806 and 808 for way <1>. Bypass select signals are applied for controlling the sense amplifier 114. The way select and bypass select signals are applied to the sense amplifier 114 in a two-level cascade of two input multiplexers 810 and 812. The wire-OR transistors 802, 804, 806, and 808, the two input multiplexers 310 and 312, and an output driver 314 are dynamic logic circuits to improve delay performance. Drivers (not shown) that increase the signal gain to a wide set (64x) of two-input way select multiplexers are also dynamic logic circuits.

A scan of the sense amplifiers 114 supports readout of data in the cache arrays 104 and 105 for bitmap and debug analysis.

Figure 9:
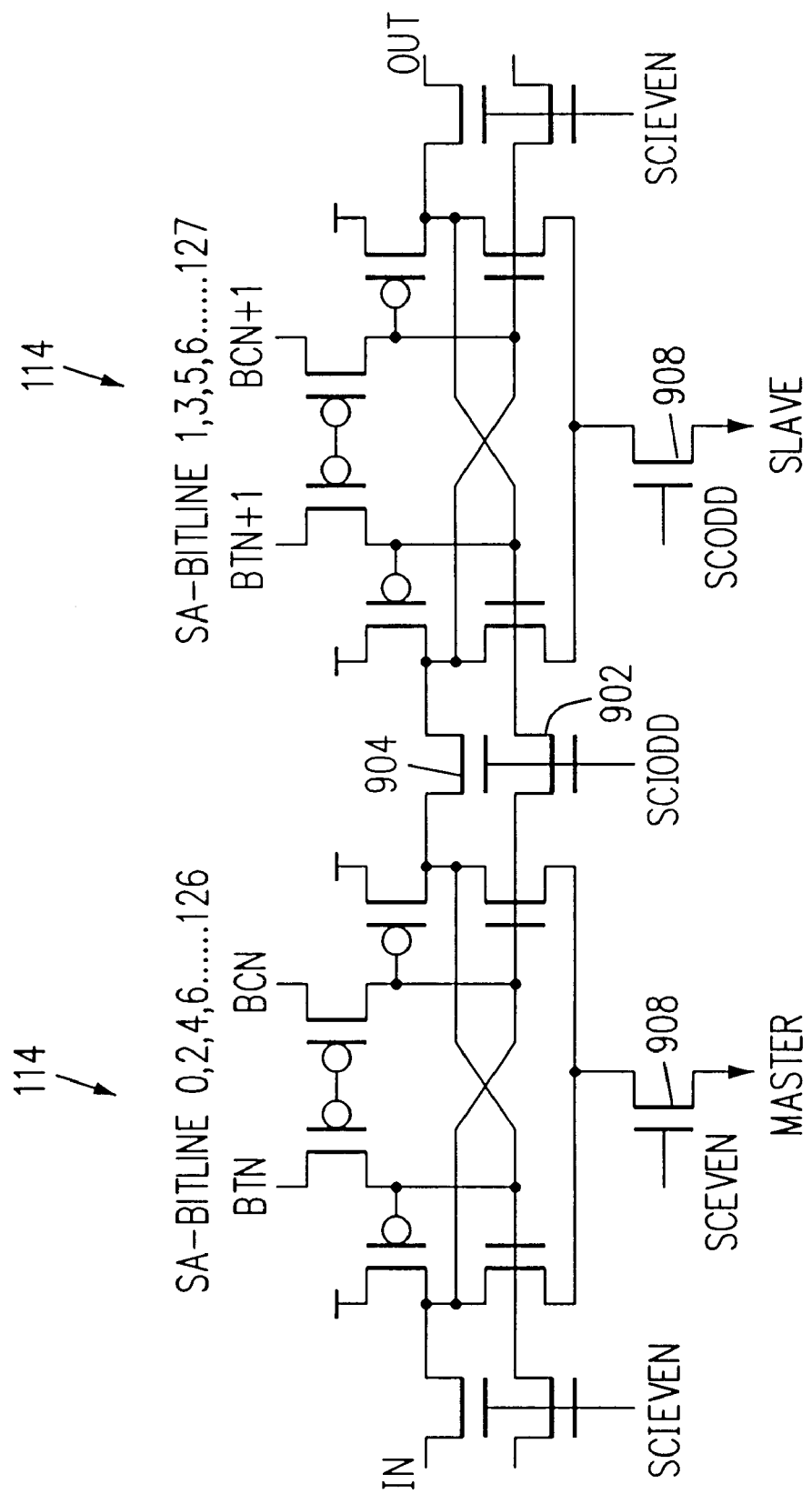
FIG. 9 is a schematic circuit diagram showing an interconnection between sense amplifiers.

Referring to FIG. 9, a simplified schematic circuit diagram shows an interconnection between sense amplifiers 114, indicating pairing of the sense amplifiers 114 in master/slave combinations. A pair of NMOS transfer gates 902 and 904 are added to column-pitched circuits between adjacent sense amplifiers 114. Auxiliary control circuits (not shown) activate sense amplifier strobes 906 in odd-even combinations to serially shift data through the chain of connected sense amplifiers 114. The NMOS transfer gates 902 and 904 are also alternately activated by transistors 908 controlled using two-phase scan clocking. A first two-phase scan clock positive transition recirculates input flip-flop data from a previous read operation accessing the memory array from a last address.

Figure 10:
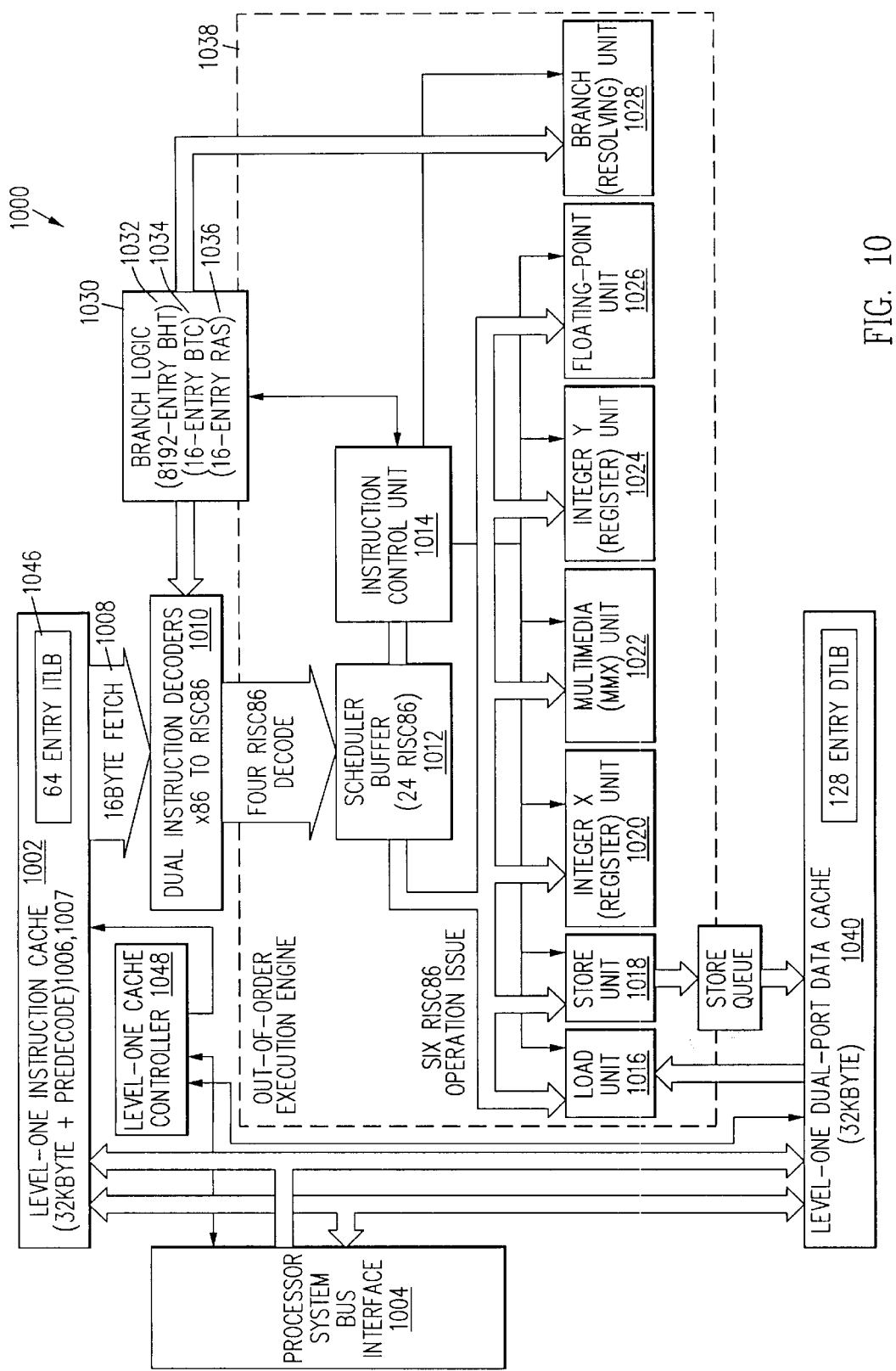
FIG. 10 is an architectural block diagram which illustrates an embodiment of a microprocessor in accordance with an embodiment of the present invention.

Referring to FIG. 10, a schematic block diagram illustrates an embodiment of an AMD-K6 microprocessor 1000. The microprocessor 1000 is an X86 instruction set-compatible microprocessor implementing a set of Multi-Media eXtenstions (MMX). A level-one (L1) instruction cache 1002 begins predecoding instructions obtained from a processor system bus interface 1004 during filing of the 32 KB two-way associative L1 instruction cache 1002. The L1 instruction cache 1002 includes a 64-entry instruction translational lookaside buffer (ITLB) 1046. Bypass (not shown) and storage buffers (not shown) for instructions (4×16) and predecode (4×20) to the L1 instruction cache 1002 are supplied to allow data-in and data flow-back to cache output terminals.

A level-one cache controller 1048 controls caching in the L1 instruction cache 1002. The L1 instruction cache 1002 uses a Most Recently Used (MRU) prediction technique to predict the way selection on cache accesses. A misprediction in the way selection results in a penalty of one cycle. The L1 instruction cache 1002 line replacement algorithm is Least Recently Used (LRU) although an alternative random replacement algorithm is supported using an SR5.ICERLR configuration bit. The L1 instruction cache 1002 also supports a direct-mapped replacement algorithm, reducing the cache size from 32 KB to 16 KB, using an SR5.ICDM configuration bit.

The L1 instruction cache 1002 performs a simple prefetching algorithm. When a line miss occurs, as distinguished from a sub-block miss, and the miss occurs on sub-block 0 of the line (bit[5] of the address is 0), then both sub-blocks are fetched and pipelined on the bus.

The microprocessor 1000 includes predecode logic 1006 and a predecode cache 1007 to identify instruction boundaries and fill the L1 instruction cache 1002. Once the L1 instruction cache 1002 is filled, predecode bits are stored in the 20 kB predecode cache 1007. Predecode bits resolved during the predecoding operation are stored in a 20 KB predecode cache 1007. Predecode logic 1006 includes a first stage of instruction decode logic. Data from the L1 instruction cache 1002 are fetched by fetch logic 1008 and transferred to dual instruction decoders 1010. The dual instruction decoders 1010 decodes up to two X86 instructions per clock and translates most instructions through a direct hardware decode operation into from one to four RISC-like operations, called RISC86 Ops. The hardware-decoded instructions are generally simple and common-type instructions. Other complex or uncommon instructions are mapped into ROM-resident sequences of RISC Ops using emulation code ROM translation.

Decoded instructions from the dual instruction decoders 1010 are transferred to a RISC86 Op Scheduler and buffer 1012. The RISC86 Op Scheduler 1012 holds up to 24 RISC Ops and stores a total of 48 registers using register renaming. The Scheduler 1012 contains logic to track instructions from decode to retirement, determining dependencies, scheduling execution, and committing architectural state. The Scheduler 1012 is structured as a FIFO queue with instructions entering the queue four at one time to match the macroinstruction decoder bandwidth and up to four instructions retiring at one time at the end of the queue. Instructions enter the Scheduler 1012 after decoding or fetching and remain in the scheduler queue until retirement. The Scheduler 1012 queue is a general structure for usage for all categories of instructions and thus serves to hold instructions directed to different execution units. The Scheduler 1012 utilizes implicit register renaming, which is based on position within the queue rather than explicit tag assignments, so that the Scheduler 1012 avoids usage of full renaming hardware.

The Scheduler 1012 manages creation and termination of operands using a hardware structure that is similar to a carry tree of a binary adder to improve speed performance, generating a carry bit for each operand while a most recent retiring or writing operation for a register terminates the carry bit. If a carry is made into a RISC86 Op and the destination of the RISC86 Op matches the operand, then that RISC86 Op is selected to supply the operand. The carry tree structure creates group generate Ggrp[7:0] and group propagate Pgrp[7:0] terms 3-RISC86 Op groups. The selection of 3-RISC86 Op groups is convenient since 24 RISC86 Ops are allocated in the Scheduler 1012. The eight group terms are combined in a three-level tree to create a group carry in terms Cgrp[7:0]. The group carry terms Cgrp[7:0] are used within each group to select the operand source Op.

The RISC86 Op Scheduler 1012, under control of an instruction control unit 1014, issues up to six RISC86 Operations using out-of-order issuing to seven parallel execution units. The execution units speculatively execute the RISC86 Ops to generate results. The RISC86 Op Scheduler 1012 retires the results in-order. The execution units include a load unit 1016, a store unit 1018, an integer X register unit 1020, a Multi-Media eXtension (unit 1022, an integer Y register unit 1024, a floating-point unit (FPU) 1026, and a branch resolving unit 1028. A branch logic unit 1030 implements a branch prediction operation that uses two-level branch prediction based on an 8192-entry Branch History Table (BEHT) 1032, a 16-entry Branch Target Cache (BTC) 1034, and a 16-entry Return Address Stack (RAS) 1036.

The dual instruction decoders 1010 translate X86 instructions on-the-fly into corresponding RISC86 Ops. The RISC86 Ops are executed by an instruction core 1038 that is essentially a RISC superscalar processing engine. The fetch logic 1008 fetches up to sixteen instruction bytes each cycle from the L1 instruction cache 1002 and transfers the instruction bytes into an instruction buffer (not shown) preceding the dual instruction decoders 1010 so that the instruction buffer is maintained at capacity. The dual instruction decoders 1010 accesses the instruction bytes from the instruction buffer, decodes up to two X86 instructions, immediately recognizes and predicts branches, and generates up to four RISC86 Ops. The RISC86 Ops are loaded into the unified RISC86 Op Scheduler 1012. The RISC86 Op Scheduler 1012 controls and tracks multiple aspects of RISC86 Op issue and execution.

The microprocessor 1000 executes up to six operations per clock. Each cycle up to six RISC86 Ops are issued and executed in a pipelined manner. The six RISC86 Ops may include one memory read operation, one memory write operation, two integer and/or one multi-media register operation, one floating point operation, and one evaluation of a branch condition. The RISC86 Ops are executed out-of-order and are executed subject principally to actual dependencies and resource constraints. One example of a resource constraint is that a maximum of two integer register operations (RegOps) is executed per cycle. Once execution of the RISC86 Ops is complete, the RISC86 Op Scheduler 1012, functioning as a reorder buffer, commits the RISC86 Ops in-order to ensure precise exception handling and full operational comparability with X86 architecture standards. The RISC86 Op Scheduler 1012 performs implicit register renaming based upon position within the scheduler buffer (queue) rather than explicit tag assignments that are conventionally employed in systems that use a reorder buffer. The position-based register renaming reduces the size of renaming hardware. The RISC86 Op Scheduler 1012 has a first-in-first-out FIFO) buffer physical structure and performs implicit register renaming, characteristics which, in combination, advantageously permit the use of fast position-based instruction issue and dependency-tracking logic. The dependency-tracking logic has characteristics of many fast adder circuits in which the process of searching for a particular operand is similar to the arithmetic operation of propagating a carry through an adder.

The load unit 1016 loads data via a level-one (L1) dual-port data cache 1040 which receives data from an external memory (not shown) via the processor system bus interface 1004. Bypass (not shown) and storage buffers (not shown) for data (4×16) to the data cache 1040 are supplied to allow data-in and data flow-back to cache output terminals.

The data cache 1040 includes a 128-entry data translational lookaside buffer (DTLB) 1044. The data cache 1040 is a 2-way set-associative, 32 KB size cache with a 64 byte line-size and 32-byte sub-blocking. The data cache 1040 fills on the basis of the 32-byte sub-block units. In contrast to the L1 instruction cache 1002, the data cache 1040 uses a Least Recently Missed (LRM) selection technique which is generally a more accurate way selection scheme than the LRU technique of the L1 instruction cache 1002. In the LRM scheme, the line that first enters the cache is replaced. An alternative random replacement algorithm is supported and activated through usage of a SR5.DCERLR configuration bit. The data cache 1040 also supports a direct-mapped replacement algorithm, reducing the cache size from 32 KB to 16 KB, using an SR5.DCDM configuration bit.

The data cache 1040 supports write allocation, which is disabled by setting an SR5.WAD configuration bit. Write allocation is allowed when caching is enabled through miscellaneous cache enable/disable bits and either of two conditions is true. A first condition is that a write operation hits on a line but misses on the requested sub-block. The second condition is that a write operation missed on a line but hit on a one-page cacheability control register used specifically on write-allocate operations. The cacheability control register is invalidated during RESET, translation lookaside buffer invalidations, or cache invalidations initiated by an INVD/WBINVD instruction. Snoop invalidations do not affect the cacheability control register. The cacheability control register is updated/validated on every fill with the page address of the line that was filled into the cache upon initiation by a load operation. Another cacheability control register is validated on write operations to the bus when the writes are determined to be cacheable.

The data cache 1040 supports one read operation and one write operation on each cycle to either independent or dependent addresses. Stalls occur on cache misses or when a data dependency occurs that is not handled by hardware. For example, a stall takes place upon the occurrence of a read operation with a superset dependency on an older write operation that has not yet been cached. A superset dependency is defined as a read operation that requests more bytes than a write operation can supply. Address dependencies are detected by monitoring the number of requested bytes and a limited number of address bits (address bits [9:0]) due to timing constraints so that false dependencies may be detected, resulting in unnecessary stalls.

The store unit 1018 transfers data to the data cache 1040 through a store queue 1042.

The Mu unit 1022 is implemented to incorporate an X86 instruction subset called the Multi-Media eXtensions thereby supporting a growing number of applications in the areas of communications and multimedia. The MMX unit 1022 supports the new instructions and the new data types that are defined by the MMX standard to increase processor performance in the targeted applications. The Mu unit 1022 executes a Single Instruction, Multiple Data (SIMD) technique to process multiple operands of 8, 16, or 32 bits in a 64-bit data path to perform highly parallel and computationally intensive algorithms that are typical for multimedia applications. The MNX unit 1022 supports 57 new instructions that execute additions, subtractions, multiplies, multiply-accumulates, logical shifts, arithmetic shifts, and several other operations. Most operations are executed on operands of any data type.

Figure 11:
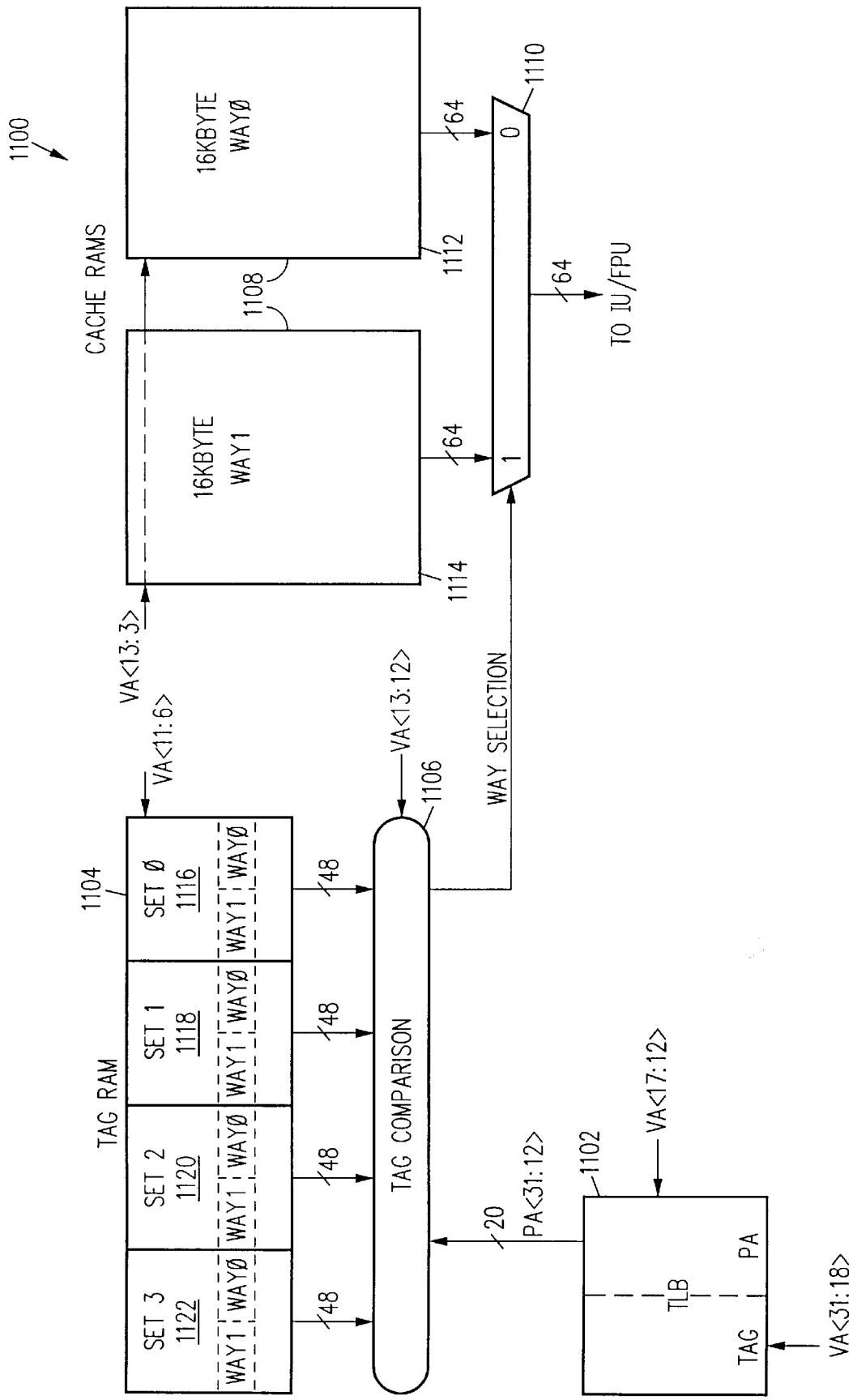
FIG. 11 is a schematic block diagram showing an embodiment of a cache and translation lookaside buffer (TLB) that is suitable for usage in the cache block shown in FIG. 1.

Referring to FIG. 11, a schematic block diagram illustrates an embodiment of a control circuit 1100 portion of the cache block 102 (shown in FIG. 1) for implementing cache control using a translational lookaside buffer (TLB) 1102. The cache control circuit 1100 includes a tag RAM 1104, the TLB 1102, a tag comparison circuit 1106, a cache RAM 1108, and a multiplexer 1110. A tag RAM 1104, for example the instruction tag RAM, contains 512 20-bit physical tags. Each tag has two additional bits for status, and each pair of tags share a most-recently-used (MRU) bit. The tag RAM 1104 is logically a two-way set-associative memory. The tag comparison circuit 1106 has eight sets of tag-TLB comparators (not shown) and eight sets of snoop comparators (not shown). Eight tags are read in each cycle and compared to data from the TLB 1102 so that all possible synonyms are checked in a single cycle, optimizing the speed of the cache block 102 at the expense of additional layout complexity and area. The tag RAM 1104 performs a read operation in a first half cycle and a write operation in a second half cycle of a processor cycle. Write data is available at the beginning of the first half cycle and is bypassed to read output terminals with no read access penalty. The tag RAM 1104 includes circuits (not shown) implementing self-resetting circuit techniques and achieves a simulated access time of 1.7 ns (excluding operation of the comparators) driving a load of 1 pf.

The cache RAM 1108 includes two ways, way 0 1112 and way 1 1114. The cache RAM 1108 and the TLB 1102 each have 256 sets. Each of the 256 sets contains two ways (or lines) and each line contains two sub-blocks so that the total number of bytes is 256×2×64 or 32 KB. Both the L1 instruction cache 1002 and the data cache 1040 (shown in FIG. 10) are 32 KB, virtually-indexed, two-way set-associative caches with a 64 byte-line size and 32 byte sub-blocking. Cache fills are performed on a sub-block basis.

Both the L1 instruction cache 1002 and the data cache 1040 are virtually indexed with only bits [13:12] of the index address being virtual. Bits [13:6] of the address define the set index of the address. Accordingly, each line resides in one set of a group of four sets with the groups being defined by the different combinations of bits [13:12]. The tag RAM 1104 in both the L1 instruction cache 1002 and the data cache 1040 include special modifications for supporting reading of the group of four sets in one cycle. The tag RAM 1104 is separated into four sets including set 0 1116, set 1 1118, set 2 1120, and set 3 1122. Each of the four sets in the tag RAM 1104 include two ways, a way 0 and a way 1. The tag RAM 1104 is effectively indexed by address bits [11:6] for read operations and a total of eight tags are read on every access of the tag RAM 1104. The tag comparison circuit 1106 compares all eight tags to a 20-bit physical address signal on physical address lines pa<31:12> from the TLB 1102 to detect virtual index aliasing during tag lookup. When the tag comparison circuit 1106 detects an alias, the cache line or sub-block is invalidated or, if dirty, written-back to memory. Then the cache line or sub-block at the address is returned to the cache block 102 and entered into a new set corresponding to the new linear index. In this manner, the TLB 1102 disallows creation of aliases by ensuring that a line or sub-block resides in only one of the possible group of four sets.

In the L1 instruction cache 1002, aliases are handled during cache line fills without penalty. The occurrence of an alias merely results in the invalidation of the appropriate cache line. In the L1 data cache 1040, aliases for both read operations and write operations are handled by performing a state sequence that prevents disturbance from internal or external snoops while the lines are in process of eviction from the cache into a 4×64-bit write eviction buffer or write-back buffer (not shown). If an aliased line is dirty, the L1 instruction cache 1002 performs a write back operation after the eviction into the write-back buffer. Once the alias is eliminated, the line is returned to the cache and deposited into a new set at a location corresponding to the new linear index.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

For example, although the illustrative embodiment shows a self-timed pulse control (STPC) circuit that is utilized in the application of supplying strobe timing to a sense amplifier, and correcting timing difficulties or logic races resulting from inaccuracies in parasitic extraction tools, mispredictions made in critical path simulations, and mismatching of devices, an STPC circuit may be applied as a solution for numerous and varied other timing problems.

Also, the illustrative embodiments depict Self-Timed Pulse Control (STPC) circuits having structures including a plurality of CMOS inverters having delays modulated by transistor stacks and inverters having delays modulated by switched capacitors. Other embodiments may be implemented that utilize other controlled delay structures that are known in the art of electronics.

What is claimed is:

1. A modulation circuit for modulating timing of a timing signal, the timing signal for controlling timing of a timed circuit, the timed circuit being integrated into an integrated circuit, the modulation circuit comprising:

an input timing signal terminal;

a timing control storage; and a controlled variable timing element integrated into the integrated circuit, the timing element having an input terminal coupled to the input timing signal terminal for receiving a timing signal, having a control terminal coupled to the timing control storage for receiving a modulation control signal, and having an output terminal generating a modulated timing signal having a timing based on the timing signal and the modulation control signal, wherein the controlled variable timing element is a controlled variable delay line including:

one or more CMOS inverters, the individual CMOS inverters inserting delay into the timing element; and one or more transistor stacks coupled to an individual CMOS inverter of the CMOS inverters and coupled to the timing control storage, the transistor stacks reducing delay of the CMOS inverters when selected by a signal from the timing control storage.

2. A modulation circuit according to claim 1, wherein:

the controlled variable timing element is a controlled variable delay line.

3. A modulation circuit according to claim 1, wherein:

the timing signal is a system clock signal and the modulated timing signal is a strobe signal for driving a sense amplifier of a memory.

4. A modulation circuit according to claim 1, wherein:

the timing control storage is a plurality of flip-flops.

5. A modulation circuit according to claim 1, wherein:

the timing control storage is a scannable register.

6. A circuit comprising:

a regenerative self-timed sense amplifier;

a modulation circuit integrated into an integrated circuit and coupled to the sense amplifier, the modulation circuit generating a timing signal for controlling timing of the sense amplifier, the modulation circuit including:

an input timing signal terminal;

a timing control storage; and a controlled variable tiring element integrated into the integrated circuit, the timing element having an input terminal coupled to the input timing signal terminal for receiving a timing signal, having a control terminal coupled to the timing control storage for receiving a modulation control signal, and having an output terminal generating a modulated timing signal having a timing based on the timing signal and the modulation control signal, wherein the controlled variable timing element is a controlled variable delay line including:
  one or more CMOS inverters, the individual CMOS inverters inserting delay into the timing element; and
  one or more transistor stacks coupled to an individual CMOS inverter of the CMOS inverters and coupled to the timing control storage, the transistor stacks reducing delay of the CMOS inverters when selected by a signal from the timing control storage.

7. A circuit according to claim 6, wherein:
the controlled variable timing element is a controlled variable delay line.

8. A circuit according to claim 6, wherein:
the timing signal is a system clock signal and the modulated timing signal is a strobe signal for driving a sense amplifier of a memory.

9. A circuit according to claim 6, wherein:
the timing control storage is a plurality of flip-flops.

10. A circuit according to claim 6, wherein:
the timing control storage is a scannable register.

11. A processor comprising:
an execution engine;
an instruction decoder coupled to the execution engine, the instruction decoder decoding instructions and supplying operations to the execution engine for execution;
a cache coupled to the instruction decoder, the cache supplying instructions to the instruction decoder for decoding into operations, the cache having a circuit including:
  a regenerative self-timed sense amplifier;
  a modulation circuit integrated into an integrated circuit and coupled to the sense amplifier, the modulation circuit generating a timing signal for controlling timing of the sense amplifier, the modulation circuit including:
    an input timing signal terminal;
    a timing control storage; and
    a controlled variable timing element integrated into the integrated circuit, the timing element having an input terminal coupled to the input timing signal terminal for receiving a timing signal, having a control terminal coupled to the timing control storage for receiving a modulation control signal, and having an output terminal generating a modulated timing signal having a timing based on the timing signal and the modulation control signal, wherein the controlled variable timing element is a controlled variable delay line including:
      one or more CMOS inverters, the individual CMOS inverters inserting delay into the timing element; and
      one or more transistor stacks coupled to an individual CMOS inverter of the CMOS inverters and coupled to the timing control storage, the transistor stacks reducing delay of the CMOS inverters when selected by a signal from the timing control storage.

12. A processor according to claim 11, wherein:
the controlled variable timing element is a controlled variable delay line.

13. A processor comprising:
an execution engine;
an instruction decoder coupled to the execution engine, the instruction decoder decoding instructions and supplying operations to the execution engine for execution;
a cache coupled to the instruction decoder, the cache supplying instructions to the instruction decoder for decoding into operations, the cache including:
  a cache array;
  a tag memory coupled to the cache array;
  a translation lookaside buffer;
  a comparator coupled to the translation lookaside buffer and coupled to the tag memory, the comparator for comparing a tag stored in the tag memory to data stored in the translation lookaside buffer and determining whether a selected data is stored in the cache array; and
  a modulation circuit integrated into an integrated circuit and coupled to the comparator, the modulation circuit generating a timing signal for controlling timing of a tag received from the tag memory to data received from the translation lookaside buffer, the modulation circuit including:
    an input timing signal terminal;
    a timing control storage; and
    a controlled variable timing element integrated into the integrated circuit, the timing element having an input terminal coupled to the input timing signal terminal for receiving a timing signal, having a control terminal coupled to the timing control storage for receiving a modulation control signal, and having an output terminal generating a modulated timing signal having a timing based on the timing signal and the modulation control signal.

14. A processor according to claim 13, wherein:
the controlled variable timing element is a controlled variable delay line.

15. A processor according to claim 13, wherein:
the controlled variable timing element is a controlled variable delay line including:
  one or more CMOS inverters, the individual CMOS inverters inserting delay into the timing element; and
  one or more transistor stacks coupled to an individual CMOS inverter of the CMOS inverters and coupled to the timing control storage, the transistor stacks reducing delay of the CMOS inverters when selected by a signal from the timing control storage.

16. A processor according to claim 13, wherein:
the controlled variable timing element is a controlled variable delay line including:
  one or more inverters, the individual inverters inserting delay into the timing element;
  a switched capacitor coupled to the individual CMOS inverter of the CMOS inverters, the switched capacitor including a capacitor and a switch, transistor stacks reducing delay of the CMOS inverters when the switch is selected.

17. A modulation circuit for modulating timing of a timing signal, the timing signal for controlling timing of a timed circuit, the timed circuit being integrated into an integrated circuit, the modulation circuit comprising:
an input timing signal terminal;
a timing control storage; and
a controlled variable timing element integrated into the integrated circuit, the timing element having an input terminal coupled to the input timing signal terminal for receiving a timing signal, having a control terminal coupled to the timing control storage for receiving a modulation control signal, and having an output terminal generating a modulated timing signal having a timing based on the timing signal and the modulation control signal, wherein the controlled variable timing element is a controlled variable delay line including:

one or more inverters, the individual inverters inserting delay into the timing element;

a switched capacitor coupled to the individual CMOS inverter of the CMOS inverters, the switched capacitor including a capacitor and a switch, transistor stacks reducing delay of the CMOS inverters when the switch is selected.

18. A modulation circuit according to claim 17, wherein:

the controlled variable timing element is a controlled variable delay line.

19. A modulation circuit according to claim 17, wherein: the timing signal is a system clock signal and the modulated timing signal is a strobe signal for driving a sense amplifier of a memory.

20. A modulation circuit according to claim 17, wherein: the timing control storage is a plurality of flip-flops.

21. A modulation circuit according to claim 17, wherein: the timing control storage is a scannable register.

22. A circuit comprising:

a regenerative self-timed sense amplifier;

a modulation circuit integrated into an integrated circuit and coupled to the sense amplifier, the modulation circuit generating a timing signal for controlling timing of the sense amplifier, the modulation circuit including:

an input timing signal terminal;

a timing control storage; and a controlled variable timing element integrated into the integrated circuit, the timing element having an input terminal coupled to the input timing signal terminal for receiving a timing signal, having a control terminal coupled to the timing control storage for receiving a modulation control signal, and having an output terminal generating a modulated timing signal having a timing based on the timing signal and the modulation control signal, wherein the controlled variable timing element is a controlled variable delay line including:

one or more inverters, the individual inverters inserting delay into the timing element;

a switched capacitor coupled to the individual CMOS inverter of the CMOS inverters, the switched capacitor including a capacitor and a switch, transistor stacks reducing delay of the CMOS inverters when the switch is selected.

23. A circuit according to claim 22, wherein:

the controlled variable timing element is a controlled variable delay line.

24. A circuit according to claim 22, wherein:

the timing signal is a system clock signal and the modulated timing signal is a strobe signal for driving a sense amplifier of a memory.

25. A circuit according to claim 22, wherein:

the timing control storage is a plurality of flip-flops.

26. A circuit according to claim 22, wherein:

the timing control storage is a scannable register.

27. A processor comprising:

an execution engine;

an instruction decoder coupled to the execution engine, the instruction decoder decoding instructions and supplying operations to the execution engine for execution;

a cache coupled to the instruction decoder, the cache supplying instructions to the instruction decoder for decoding into operations, the cache having a circuit including:

a regenerative self-timed sense amplifier;

a modulation circuit integrated into an integrated circuit and coupled to the sense amplifier, the modulation circuit generating a timing signal for controlling timing of the sense amplifier, the modulation circuit including:

an input timing signal terminal;

a timing control storage; and a controlled variable timing element integrated into the integrated circuit, the timing element having an input terminal coupled to the input tiring signal terminal for receiving a timing signal, having a control terminal coupled to the timing control storage for receiving a modulation control signal, and having an output terminal generating a modulated timing signal having a timing based on the timing signal and the modulation control signal, wherein the controlled variable timing element is a controlled variable delay line including:

one or more inverters, the individual inverters inserting delay into the timing element;

a switched capacitor coupled to the individual CMOS inverter of the CMOS inverters, the switched capacitor including a capacitor and a switch, transistor stacks reducing delay of the CMOS inverters when the switch is selected.

28. A processor according to claim 27, wherein:

the controlled variable timing element is a controlled variable delay line.

29. A memory circuit comprising:

a memory; and a regenerative self-timed sense amplifier coupled to the memory for sampling bit line output signals from the memory at a time determined by a strobe signal to generate a sensed output signal, the strobe signal being generated by a self-timed pulse control circuit having a controlled variable timing element for delaying an input timing signal by a time delay dependent on a modulation control signal received from a timing control storage coupled to the self-timed pulse control circuit, the timing control storage being programmed to set the time delay to a time duration that prevents logic races in the regenerative self-timed sense amplifier, the controlled variable timing element including:

one or more CMOS inverters, the individual CMOS inverters inserting delay into the timing element; and one or more transistor stacks coupled to an individual CMOS inverter of the CMOS inverters and coupled to the timing control storage, the transistor stacks reducing delay of the CMOS inverters when selected by a signal from the timing control storage.

30. A memory circuit according to claim 29 wherein the timing control storage stores at least three control input bits to the variable timing element, the bits being coded or combined to vary the delay.

31. A memory circuit according to claim 29 wherein the controlled variable timing element is a controlled variable delay line.

32. A memory circuit according to claim 29 wherein the timing signal is a system clock signal.

33. A memory circuit according to claim 29 wherein the timing control storage is a plurality of flip-flops.

34. A memory circuit according to claim 29 wherein the timing control storage is a scannable register.

35. A memory circuit comprising:

a memory; and a regenerative self-timed sense amplifier coupled to the memory for sampling bit line output signals from the memory at a time determined by a strobe signal to generate a sensed output signal, the strobe signal being generated by a self-timed pulse control circuit having a controlled variable timing element for delaying an input timing signal by a time delay dependent on a modulation control signal received from a timing control storage coupled to the self-timed pulse control circuit, the timing control storage being programmed to set the time delay to a time duration that prevents logic races in the regenerative self-timed sense amplifier, the controlled variable timing element including:

one or more inverters, the individual inverters inserting delay into the timing element; and a switched capacitor coupled to an individual inverter of the inverters, the switched capacitor including a capacitor and a switch for connecting the capacitor to the inverter when selected by a signal from the timing control storage.

36. A memory circuit according to claim 35 wherein the timing control storage stores at least three control input bits to the variable timing element, the bits being coded or combined to vary the delay.

37. A memory circuit according to claim 35 wherein the controlled variable timing element is a controlled variable delay line.

38. A memory circuit according to claim 35 wherein the timing signal is a system clock signal.

39. A memory circuit according to claim 35 wherein the timing control storage is a plurality of flip-flops.

40. A memory circuit according to claim 35 wherein the timing control storage is a scannable register.

* * * * *